(12) United States Patent
Mu et al.

(10) Patent No.: US 8,879,330 B1
(45) Date of Patent: Nov. 4, 2014

(54) NON-VOLATILE MEMORY (NVM) WITH VARIABLE VERIFY OPERATIONS

(71) Applicants: Fuchen Mu, Austin, TX (US); Yanzhuo Wang, Austin, TX (US)

(72) Inventors: Fuchen Mu, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/874,119

(22) Filed: Apr. 30, 2013

(51) Int. Cl.
*G11C 11/34* (2006.01)
*G11C 16/34* (2006.01)

(52) U.S. Cl.
CPC ................... *G11C 16/3445* (2013.01)
USPC .................. 365/185.22; 365/185.29; 365/211

(58) Field of Classification Search
USPC .................... 365/185.09, 185.22, 185.29, 211
See application file for complete search history.

(56) References Cited

U.S. PATENT DOCUMENTS

| | | | |
|---|---|---|---|
| 6,381,670 B1 * | 4/2002 | Lee et al. ....................... | 711/103 |
| 7,397,703 B2 * | 7/2008 | Niset et al. ............... | 365/185.22 |
| 7,839,690 B2 | 11/2010 | Lee et al. | |
| 7,920,427 B2 * | 4/2011 | Marquart ................. | 365/185.19 |

* cited by examiner

*Primary Examiner* — Son Dinh
(74) *Attorney, Agent, or Firm* — Mary Jo Bertani; James L. Clingan, Jr.

(57) ABSTRACT

A method of erasing a non-volatile memory (NVM) array includes determining a first number based on a temperature of the NVM array. Erase pulses of the first number are applied to the NVM array. A first verify of the NVM is performed for a first time after commencing the applying after the first number has been reached.

20 Claims, 3 Drawing Sheets

110 ⟶

| INITIAL SETTINGS | | |
|---|---|---|
| TEMP °C | PULSE COUNT DATA (PCD) | NREG = 50% PCD |
| -40 ≤ T < 0 | 30 | 15 |
| 0 ≤ T < 40 | 28 | 14 |
| 40 ≤ T < 80 | 26 | 13 |
| 80 ≤ T < 120 | 24 | 12 |
| 120 ≤ T < 160 | 22 | 11 |
| 160 ≤ T < 200 | 20 | 10 |

| SETTINGS AFTER 100 K ERASE OPERATIONS AT 80 ≤ T < 120 °C | | |
|---|---|---|
| TEMP °C | PULSE COUNT DATA (PCD) | NREG = 50% PCD |
| -40 ≤ T < 0 | 30 | 15 |
| 0 ≤ T < 40 | 28 | 14 |
| 40 ≤ T < 80 | 26 | 13 |
| 80 ≤ T < 120 | 34 | 17 |
| 120 ≤ T < 160 | 22 | 11 |
| 160 ≤ T < 200 | 20 | 10 |

NON-VOLATILE MEMORY (NVM) WITH VARIABLE VERIFY OPERATIONS

BACKGROUND

1. Field of the Disclosure

This disclosure relates generally to non-volatile memories (NVMs), and more specifically, to NVMs that perform a variable number of verify operations.

2. Description of the Related Art

Typical non-volatile memories (NVMs) use charge pumps for generating erase voltages to apply to the memory cells during program and erase operations. The voltages selected for program and erase operations are based on desirable characteristics for the threshold voltage distribution of the memory cells and the program and erase performance of the cells that are programmed or erased. For a given NVM, there is a determined charge pump voltage for program and erase for each relevant node. For erase this is typically the gate voltage and the well voltage on the memory cells. For programming this is typically the gate voltage and the drain voltage on the memory cells.

The operational cycles can include modes such as pre-program, erase, compaction and soft program during which a series of voltage pulses are applied to the memory cells. Each of the operational cycles can include a verify operation to ensure that a specified number of the memory cells are in the intended state. The verify operations are performed after each series of voltage pulses are applied. If the cells do not pass verify, then another series of voltage pulses which could be at a higher voltage level, depending on the specific operation being performed, is applied until the specified number of cells are in the intended state. The number of voltage pulse series that are applied typically increases with the lifecycle age of the memory array. The increase in the number of pulse series affects the amount of time required to complete an operation. In addition, temperature will also impact the number of pulse series, with the number of pulse series increasing proportionally with age. The number of erase pulse series decreases with temperature. The number of program pulse series increases with temperature.

Thus there is a need for erase operations that improve erase performance and reliability over the life of the memory and erase time.

BRIEF DESCRIPTION OF THE DRAWINGS

The benefits, features, and advantages of the present disclosure will become better understood with regard to the following description, and accompanying drawings where:

FIG. 4 is an embodiment of a pulse count data table that can be used in the NVM device of FIG. 1.

FIG. 5 is an embodiment of another pulse count data table that can be used in the NVM device of FIG. 1.

DETAILED DESCRIPTION

Embodiments of methods and devices of a non-volatile memory are disclosed in which verify operations are suspended after the preliminary verify operation until a selected number of voltage pulse series have been applied to some or all of an array of memory cells. The selected number of voltage pulse series can be based on temperature and the number operations that have been performed on the array. This is better understood by reference to the drawings and the following written description.

Figure 1:
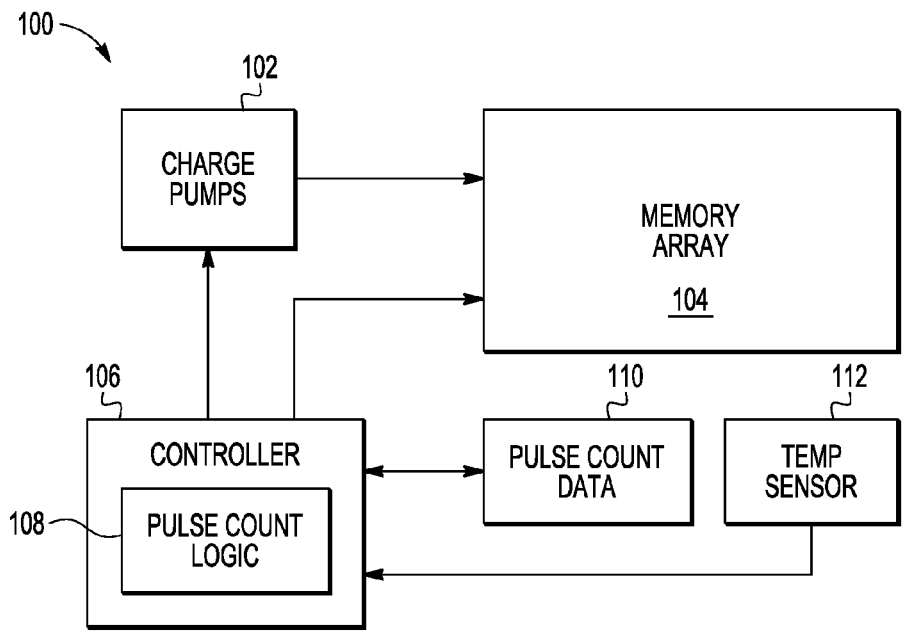
FIG. 1 is a block diagram of a non-volatile memory (NVM) device according to an embodiment.

Shown in FIG. 1 is a non-volatile memory (NVM) device 100 having a set of charge pumps 102, a memory controller 106 coupled to charge pumps 102, a pulse count data table 110 coupled to controller 106, a temperature sensor 112 coupled to controller 106, and an NVM array 104 coupled to charge pumps 102. NVM array 104 typically includes row decoders, column decoders, and sense amplifiers (not shown in the figure) that are used to operate memory cells in the NVM array. Controller 106 controls the operations of NVM array 104 including reading, programming, and erasing.

Pulse count logic 108 can be included in controller 106 to determine when to start using verify operations during various memory operations, such as pre-program, erase, compaction, soft program, and program operations. Pulse count logic 108 can use information from pulse count data 110 to determine whether to increase the number of series of pulses to apply to the memory cells before initiating verify operations based on the number of series of pulses previously applied. The pulse count data 110 can be updated to reflect the increased number. The number of series of pulses required to pass a verify operation will typically increase with lifecycle age and/or with changes in operating temperature, depending on the operation being performed. Pulse count data 110 can be implemented as a look-up table, one or more formulas, or other suitable implementations. Pulse count data 110 can be stored for one or more lifecycle ages, such as initial, 100,000, 200,000, and 250,000 cycles, and for one or more ranges of temperatures. Pulse count logic 108 can apply a factor such as a percentage to the pulse count for a particular lifecycle age and temperature range to generate a value for a specified number of pulse series to perform before verifying the memory operations.

Figure 2:
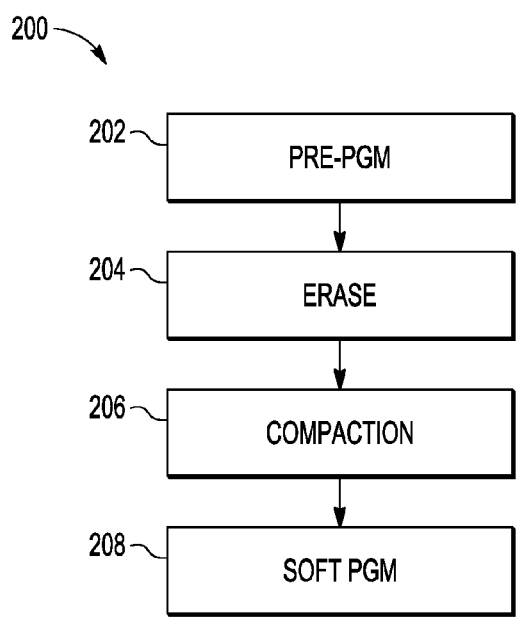
FIG. 2 is a flow diagram of an embodiment of operations that can be performed by the NVM device of FIG. 1.

Referring now to FIGS. 1 and 2, FIG. 2 shows a flow diagram of an embodiment of operations that can be performed by the NVM device of FIG. 1 including pre-program operation 202, erase operation 204, compaction operation 206, and soft program operation 208. Pre-program operation 202 can include determining whether a pre-program operation is required to bring all cells in the NVM array 104 to a pre-program level. The pre-program threshold voltage level will depend on the configuration/technology of the transistors that form the memory cells. For erase operation 204, the threshold voltage of all of the memory cells is brought to an erased level. Compaction operation 206 can be performed to insure that the threshold voltage of all of the memory cells is above a minimum compaction level. Soft program operation 208 can be performed to insure the threshold voltage of all of the memory cells is above a minimum soft program level.

A series of voltage pulses is applied to the memory cells in NVM array 104. After a specified number of voltage pulse series is applied, a verify operation is performed to ensure the threshold voltage of all the memory cells is above (or below) a specified verify level for the operation being performed. One or more series of pulses can subsequently be applied to the memory cells until the threshold voltage of all of the memory cells are above or below a respective specified verify level. For example, the erase verify operation ensures the threshold voltage of all the memory cells is below erase verify level. Soft program verify operation ensures the threshold voltage of all the memory cells is above soft program verify level. The respective verify operation can be performed after each subsequent series of pulses is applied. The delay in initially performing the verify operation until a specified number of pulse series have been applied reduces the amount of time required to perform the pre-program, erase, compaction and soft program operations during manufacturing test and field operation. The specified number of pulses can also be changed after performing a verify operation if the number of pulse series applied has increased above a certain amount since the previous operation, as further described herein.

Figure 3:
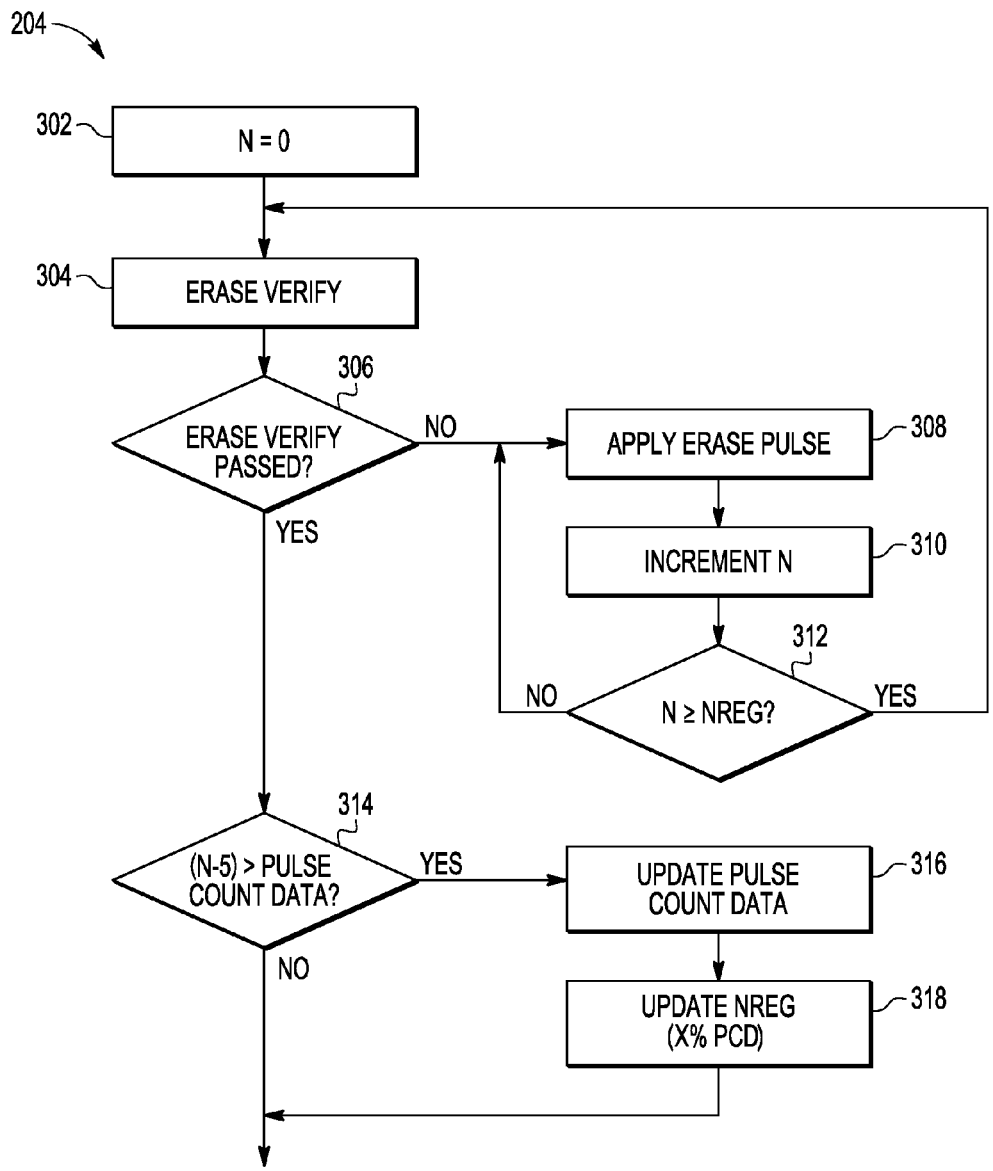
FIG. 3 is a flowchart diagram of an embodiment of an erase operation that can be performed by the NVM device of FIG. 1.

FIG. 3 is a flowchart diagram of an embodiment of method for performing an erase operation 204 that can be implemented in pulse count logic 108 of controller 106 in FIG. 1. Process 302 can include initializing a counter N to an initial value, such as zero (0). Process 304 can include performing a preliminary erase verify operation to determine whether the threshold voltage of all of the memory cells is below an erase verify voltage level. If the threshold voltage of all of the memory cells is below the erase verify level, the erase verify operation is considered to have passed or been successful. If the erase verify operation has not passed, process 306 transitions to process 308 in which a series of erase pulses is applied to the memory cells. Once the series of erase pulses have been applied, process 310 increments the counter N by one (1), which indicates the number of erase pulse series that have been applied. Process 312 can include determining whether the counter N is greater than or equal to a specified number of pulse series, represented in FIG. 3 by NREG. If counter N is greater than or equal to the specified number of pulse series NREG, process 312 transitions to process 304. If counter N is less than the specified number of pulse series NREG, process 312 transitions to process 308.

If process 306 determines that erase verify passed, process 314 determines whether the counter N is greater than a pulse count data value. The pulse count data value is obtained from pulse count data 110 (FIG. 1). In the example shown, if N minus a margin value (e.g., 5) is greater than the pulse count data value, process 316 updates the pulse count data value with the value of counter N in pulse count data 110. In some embodiments, the value in a look-up table for the particular lifecycle age and temperature range can be updated in process 316. In other implementations, coefficients of one or more equations that are used to calculate the pulse count data value can be updated in process 316. Other suitable techniques for implementing and updating the pulse count data value can be used.

After the pulse count data value is updated in process 316, process 318 can include updating the specified number of pulse series NREG based on the updated pulse count data value. The specified number of pulse series NREG can be a percentage of the pulse count data value. The percentage can be specified by a user. A lower percentage will result in the verify operations being conducted after a fewer number of pulse series, while a higher percentage will result in the verify operations being conducted after a greater number of pulse series. Similarly to the updated pulse count data value, the updated specified number of pulse series NREG can be specific to a particular range of temperatures and/or lifecycle age of the corresponding memory array.

Referring back to process 314, if the counter N is less than or equal to the pulse count data value, within the margin value (e.g. a margin of 5 counts), the erase operation 204 ends. Controller 106 may then perform compaction operation 206 (FIG. 2) and soft program operation 208 (FIG. 2).

FIG. 4 is an embodiment of an erase pulse count data table 110 that can be used in the NVM device 100 of FIG. 1. The data can be used for an NVM memory device that has a lifecycle age lower than a particular threshold, such as 100,000 cycles, for example. Pulse count data values and corresponding specified number of pulse series NREG can be supplied for a number of temperature ranges. The value of NREG will be a percentage of the corresponding pulse count data value, such as 50, 75, or 95 percent. Other suitable percentage values can be set by a user based on how quickly the verify operations are to begin during memory operations such as pre-program, erase, compaction, and soft program.

In the example shown, first temperature range 402 varies from −40 to 0 degrees Centigrade and has a corresponding pulse count data value of 30. The corresponding number of pulse series NREG is 15, which is 50 percent of the pulse count data value. Second temperature range 404 varies from 0 to 40 degrees Centigrade and has a corresponding pulse count data value of 28 and number of pulse series NREG of 14. Third temperature range 406 varies from 40 to 80 degrees Centigrade and has a corresponding pulse count data value of 26 and number of pulse series NREG of 13. Fourth temperature range 408 varies from 80 to 120 degrees Centigrade and has a corresponding pulse count data value of 24 and number of pulse series NREG of 12. Fifth temperature range 410 varies from 120 to 160 degrees Centigrade and has a corresponding pulse count data value of 22 and number of pulse series NREG of 11. Sixth temperature range 412 varies from 160 to 200 degrees Centigrade and has a corresponding pulse count data value of 20 and number of pulse series NREG of 10.

Note that pulse count data 110 can include additional or fewer temperature ranges, different pulse count data values, and use a different percentage to determine the specified number of pulse series NREG.

FIG. 5 is an embodiment of another pulse count data 110 in table form that can be used in the NVM device 100 of FIG. 1. Comparing FIG. 4 to FIG. 5, pulse count data values for temperature ranges 402-406 and 410-412 remain the same. Temperature range 408 has been updated to reflect an increase in the number of pulse series required to perform an erase operation after the memory array has a lifecycle age of 100,000 cycles. In the example shown, the pulse count data for temperature range 408 has increased to 34 (from 24 in FIG. 4) and the specified number of pulse series NREG has changed to 17 (from 12 in FIG. 4). Thus, the number of pulse series that will be performed before initiating corresponding verify operations increases from 12 to 17 for temperature range 408. As a result, the time saved due to delaying the verify operations increases as the lifecycle age of the memory device increases. Additionally, pulse count data 110 achieves further performance improvement by taking into account the variation in the number of pulse series required at various operating temperatures.

The minimum number of pulses to be applied during pre-program, erase, compaction and soft program operations can be established after each operation is performed for the first time at a specific temperature range and can be stored in memory that is accessible by pulse count logic 108. The minimum number of pulses can be different for each operation, for example, the minimum number of pulses for the erase operation may be 20 pulses while the minimum number of pulses for the soft program operation may be 5 pulses. The minimum number of pulses is likely to depend on the temperature during the operation and erase cycling, and different minimum number of pulses may be stored for each range of temperatures.

By now it should be appreciated that in some embodiments, a method 200 of erasing a non-volatile memory (NVM) array (104) can comprise determining a first number (NREG) based on a temperature (112) of the NVM array, applying erase pulses (308) of the first number to the NVM array, and performing a first verify (304) of the NVM for a first time after commencing the applying after (312) the first number has been reached.

In another aspect, the method can comprise applying an additional erase pulse to the NVM array followed by a verification if the performing the first verify (304) determines erase was not successful.

In another aspect, the method can comprise determining if the first number should be updated based on a number of erase pulses required to successfully erase the NVM array.

In another aspect, the method can comprise alternately applying erase pulses and performing verifies until one of a group consisting of a determination that the erase has been successful and a failure to erase has occurred after a maximum number of erase pulses have been applied, if the performing the first verify determines erase was not successful.

In another aspect, the determining can be further characterized by the first number being further based on a number of erase cycles already performed.

In another aspect, the determining can be further characterized by the first number being further based on a number of erase cycles already performed.

In another aspect, the determining can be further characterized by the first number being selected from a plurality of numbers, wherein the plurality of numbers correspond to temperature ranges.

In another aspect, the determining is further characterized by each of the plurality of numbers is affected by changes in the number of pulses required to achieve an erase at the temperature range to which it corresponds.

In another aspect, the determining can be further characterized by each of the plurality of numbers being a percentage (FIG. 4, 5) of the number of pulses required to achieve an erase at the temperature range to which it corresponds.

In another aspect, if the performing the first verify determines erase was not successful, the method can further comprise alternately applying erase pulses and performing verifies until one of a group consisting of a determination that the erase has been successful or a failure to erase has occurred after a maximum number of erase pulses have been applied. If the erase has been successful, a compaction verify (206) can be performed on the NVM array. If compaction verify did not pass, compaction (206) can be performed on the NVM array.

In other embodiments, a non-volatile memory (NVM) can comprise an NVM array (104), charge pumps (102) that provide a power supply for use in generating erase pulses, a temperature sensor (112) that provides a signal indicative of a temperature of the NVM array, a controller (106), coupled to the NVM array, the temperature sensor, and the charge pumps that determines a first number (NREG) based on a temperature of the NVM array applies erase pulses (308) of the first number to the NVM array, and performs, for a first time after the first number of erase pulses has been reached, a first verify (304) of the NVM.

In another aspect, if the controller determines erase was not successful, the controller can alternately apply erase pulses and perform verifies until one of a group consisting of: a determination that the erase has been successful and a maximum number of erase pulses has occurred.

In another aspect, the first number can be further based on a number of erase cycles (FIGS. 4 and 5) already performed.

In another aspect, the first number can be selected from a plurality of numbers (FIGS. 4 and 5), wherein the plurality of numbers correspond to temperature ranges.

In another aspect, each of the plurality of numbers can be affected by changes in the number of pulses required to achieve an erase at the temperature range to which it corresponds.

In another aspect, each of the plurality of numbers can be a percentage (FIGS. 4 and 5) of the number of pulses required to achieve an erase at the temperature range to which it corresponds.

In still other embodiments, a method of erasing a non-volatile memory (NVM) array (104) can comprise determining a first number (NREG) of erase pulses to be applied to the NVM array based on a temperature (112) of the NVM, applying (308) the first number of erase pulses to the NVM array, determining (312) if the first number of erase pulses has been applied to the NVM array, and in response to determining that the first number of erase pulses has been applied to the NVM array, verifying (304, 306) if NVM array has been successfully erased.

In another aspect, the method can further comprise, if the NVM has not been successfully erased, applying a first additional erase pulse to the NVM array, and verifying if the NVM array has been successfully erased after the first additional erase pulse has been applied.

In another aspect, the method can further comprise, if the NVM array has not been successfully erased after the first additional erase pulse has been applied, applying further additional erase pulses to the NVM array until the NVM has been successfully erased or a maximum erase pulse count has been reached. Each further additional erase pulse can be followed by verifying if the NVM array has been successfully erased.

In another aspect, the determining can be further characterized by basing the first number on a number of erase pulses (FIGS. 4 and 5) previously required to successfully erase the NVM array.

Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. For example, other techniques for determining the charge pump voltages that go with particular arrays may be used. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method of erasing a non-volatile memory (NVM) array, comprising:
    determining a first number based on a temperature of the NVM array;
    applying erase pulses of the first number to the NVM array; and
    performing a first verify of the NVM for a first time after commencing the applying after the first number has been reached.

2. The method of claim 1 further comprising:
    if the performing the first verify determines erase was not successful, applying an additional erase pulse to the NVM array followed by a verification.

3. The method of claim 1, further comprising:
    determining if the first number should be updated based on a number of erase pulses required to successfully erase the NVM array.

4. The method of claim 1, further comprising:
    if the performing the first verify determines erase was not successful, alternately applying erase pulses and performing verifies until one of a group consisting of a determination that the erase has been successful or a failure to erase has occurred after a maximum number of erase pulses have been applied.

5. The method of claim 4, wherein the determining is further characterized by the first number being further based on a number of erase cycles already performed.

6. The method of claim 1, wherein the determining is further characterized by the first number being further based on a number of erase cycles already performed.

7. The method of claim 1, wherein the determining is further characterized by the first number being selected from a plurality of numbers, wherein the plurality of numbers correspond to temperature ranges.

8. The method of claim 7, wherein the determining is further characterized by each of the plurality of numbers is affected by changes in the number of pulses required to achieve an erase at the temperature range to which it corresponds.

9. The method of claim 8, wherein the determining is further characterized by each of the plurality of numbers being a percentage of the number of pulses required to achieve an erase at the temperature range to which it corresponds.

10. The method of claim 1, wherein:
    if the performing the first verify determines erase was not successful, alternately applying erase pulses and performing verifies until one of a group consisting of a determination that the erase has been successful or a failure to erase has occurred after a maximum number of erase pulses have been applied;
    if the erase has been successful, performing a compaction verify on the NVM array; and
    if compaction verify did not pass, performing compaction on the NVM array.

11. A non-volatile memory (NVM), comprising:
    an NVM array;
    charge pumps that provide a power supply for use in generating erase pulses;
    a temperature sensor that provides a signal indicative of a temperature of the NVM array;
    a controller, coupled to the NVM array, the temperature sensor, and the charge pumps that:
        determines a first number based on a temperature of the NVM array;
        applies erase pulses of the first number to the NVM array; and
        performs, for a first time after the first number of erase pulses has been reached, a first verify of the NVM.

12. The NVM of claim 11, wherein if the controller determines erase was not successful, the controller alternately applies erase pulses and performs verifies until one of a group consisting of a determination that the erase has been successful or a maximum number of erase pulses has occurred.

13. The NVM of claim 12, wherein the first number is further based on a number of erase cycles already performed.

14. The NVM of claim 13, wherein the first number is selected from a plurality of numbers, wherein the plurality of numbers correspond to temperature ranges.

15. The method of claim 14, wherein each of the plurality of numbers is affected by changes in the number of pulses required to achieve an erase at the temperature range to which it corresponds.

16. The method of claim 15, wherein each of the plurality of numbers is a percentage of the number of pulses required to achieve an erase at the temperature range to which it corresponds.

17. A method of erasing a non-volatile memory (NVM) array, comprising;
    determining a first number of erase pulses to be applied to the NVM array based on a temperature of the NVM;
    applying the first number of erase pulses to the NVM array;
    determining if the first number of erase pulses has been applied to the NVM array;
    in response to determining that the first number of erase pulses has been applied to the NVM array, verifying if NVM array has been successfully erased.

18. The method of claim 17, further comprising, if the NVM has not been successfully erased:
    applying a first additional erase pulse to the NVM array; and
    verifying if the NVM array has been successfully erased after the first additional erase pulse has been applied.

19. The method of claim 18, further comprising, if the NVM array has not been successfully erased after the first additional erase pulse has been applied:
    applying further additional erase pulses to the NVM array until the NVM has been successfully erased or a maximum erase pulse count has been reached, wherein each further additional erase pulse is followed by verifying if the NVM array has been successfully erased.

20. The method of claim 17, wherein the determining is further characterized by basing the first number on a number of erase pulses previously required to successfully erase the NVM array.

* * * * *